United States Patent
Han et al.

(10) Patent No.: US 10,418,585 B2
(45) Date of Patent: Sep. 17, 2019

(54) COVER UNIT AND DISPLAY DEVICE HAVING THE SAME

(71) Applicant: Samsung Display Co., Ltd., Yongin-Si, Gyeonggi-Do (KR)

(72) Inventors: Sang-woo Han, Cheonan-si (KR); Hyunhee Lee, Seoul (KR); Dongho Lee, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 136 days.

(21) Appl. No.: 15/465,359

(22) Filed: Mar. 21, 2017

(65) Prior Publication Data

US 2017/0331071 A1    Nov. 16, 2017

(30) Foreign Application Priority Data

May 12, 2016  (KR) .................. 10-2016-0058378
Jun. 1, 2016   (KR) .................. 10-2016-0068373

(51) Int. Cl.
*G02B 5/02* (2006.01)
*G02B 13/20* (2006.01)
(Continued)

(52) U.S. Cl.
CPC ............ *H01L 51/5246* (2013.01); *B32B 7/12* (2013.01); *B32B 9/045* (2013.01); *B32B 17/00* (2013.01); *B32B 27/06* (2013.01); *B32B 27/08* (2013.01); *B32B 27/281* (2013.01); *B32B 27/304* (2013.01); *B32B 27/308* (2013.01); *B32B 27/32* (2013.01); *B32B 27/36* (2013.01); *B32B 27/365* (2013.01); *G02B 5/0263* (2013.01); *G02B 5/0284* (2013.01); *G02B 5/0816* (2013.01); *G02B 5/223* (2013.01); *G02F 1/133308* (2013.01); *G06F 1/1601* (2013.01); *H01L 27/322* (2013.01); *H01L 27/323* (2013.01); *H01L 27/3244* (2013.01); *H01L 51/5253* (2013.01); *H01L 51/5271* (2013.01); *H01L 51/56* (2013.01); *H05K 5/0017* (2013.01);
(Continued)

(58) Field of Classification Search
CPC ..... H01L 51/5246; B32B 7/12; G02B 5/0263; G02B 5/0284
See application file for complete search history.

(56) References Cited

U.S. PATENT DOCUMENTS 9,231,034 B1 * 1/2016 Chen .................... H01L 27/3218
9,606,264 B1 * 3/2017 Menon .................... G02B 1/105
(Continued)

FOREIGN PATENT DOCUMENTS

KR    10-2014-0148204 A    12/2014
KR    10-2015-0042072 A     4/2015
(Continued)

*Primary Examiner* — William R Alexander
*Assistant Examiner* — Tamara Y. Washington
(74) *Attorney, Agent, or Firm* — Innovation Counsel LLP

(57) ABSTRACT

A display device includes a cover unit and a display panel coupled to the cover unit. The cover unit includes a first base member disposed on the display panel and including a first area and a second area when viewed in a plan view, a pattern layer disposed between the first base member and the display panel, a color layer disposed between the first base member and the pattern layer and having a light transmittance, and a reflective layer disposed between the display panel and the pattern layer.

26 Claims, 16 Drawing Sheets

(51) Int. Cl.

| | |
|---|---|
| *H01L 51/52* | (2006.01) |
| *G02B 5/08* | (2006.01) |
| *G02B 5/22* | (2006.01) |
| *H01L 27/32* | (2006.01) |
| *H01L 51/56* | (2006.01) |
| *H05K 5/00* | (2006.01) |
| *H05K 5/03* | (2006.01) |
| *B32B 7/12* | (2006.01) |
| *G02F 1/1333* | (2006.01) |
| *G06F 1/16* | (2006.01) |
| *B32B 9/04* | (2006.01) |
| *B32B 17/00* | (2006.01) |
| *B32B 27/06* | (2006.01) |
| *B32B 27/08* | (2006.01) |
| *B32B 27/28* | (2006.01) |
| *B32B 27/30* | (2006.01) |
| *B32B 27/32* | (2006.01) |
| *B32B 27/36* | (2006.01) |

(52) U.S. Cl.
CPC .......... H05K 5/03 (2013.01); *B32B 2255/10* (2013.01); *B32B 2255/20* (2013.01); *B32B 2255/26* (2013.01); *B32B 2307/4026* (2013.01); *B32B 2307/412* (2013.01); *B32B 2307/416* (2013.01); *B32B 2307/546* (2013.01); *B32B 2307/75* (2013.01); *B32B 2457/20* (2013.01); *G02F 2001/13332* (2013.01); *G02F 2001/133314* (2013.01); *G02F 2001/133331* (2013.01); *G02F 2001/133388* (2013.01); *G02F 2201/50* (2013.01); *G02F 2202/04* (2013.01); *G02F 2203/02* (2013.01)

(56) References Cited

U.S. PATENT DOCUMENTS

| | | | |
|---|---|---|---|
| 9,614,018 B2 * | 4/2017 | Shi | H01L 51/52 |
| 9,952,740 B1 * | 4/2018 | Kim | G06F 3/0481 |
| 10,048,486 B1 * | 8/2018 | Carneiro | G02B 26/005 |
| 2011/0074272 A1 * | 3/2011 | Sakamoto | H01L 51/5265 313/113 |
| 2013/0119857 A1 * | 5/2013 | Su | H05B 33/10 313/504 |
| 2013/0147689 A1 * | 6/2013 | Liu | G09G 3/30 345/76 |
| 2013/0258643 A1 * | 10/2013 | Helstern | G09F 13/04 362/97.1 |
| 2014/0162026 A1 * | 6/2014 | Jeon | B32B 3/263 428/172 |
| 2014/0184683 A1 * | 7/2014 | Harjee | H01L 51/0005 347/14 |
| 2014/0217431 A1 * | 8/2014 | Aoyagi | H01L 51/5284 257/89 |
| 2014/0231758 A1 * | 8/2014 | Mok | H01L 51/5296 257/40 |
| 2014/0293580 A1 * | 10/2014 | Kuan | G02B 27/06 362/97.1 |
| 2014/0367622 A1 * | 12/2014 | Yaniv | G02B 5/223 252/586 |
| 2015/0009553 A1 * | 1/2015 | Kobashi | G02F 1/167 359/296 |
| 2015/0069362 A1 * | 3/2015 | Ito | H01L 27/323 257/40 |
| 2015/0103392 A1 * | 4/2015 | Rieger | G02B 26/005 359/296 |
| 2015/0116721 A1 * | 4/2015 | Kats | G01J 3/26 356/454 |
| 2015/0146146 A1 * | 5/2015 | Lee | G02B 5/201 349/106 |
| 2015/0192729 A1 * | 7/2015 | Hosoki | G02F 1/33308 348/794 |
| 2015/0202848 A1 * | 7/2015 | Cho | B32B 27/20 428/206 |
| 2015/0226997 A1 * | 8/2015 | Tomomasa | G02F 1/133308 348/794 |
| 2015/0275009 A1 * | 10/2015 | Kobashi | C09D 11/36 359/885 |
| 2015/0336357 A1 * | 11/2015 | Kang | B32B 15/18 428/215 |
| 2015/0357305 A1 * | 12/2015 | Kawashima | H01L 27/3206 257/40 |
| 2016/0082881 A1 * | 3/2016 | Yamato | B60Q 3/217 362/511 |
| 2016/0093684 A1 * | 3/2016 | Youk | H01L 27/3272 257/40 |
| 2016/0185082 A1 * | 6/2016 | Taherloo | B32B 37/185 428/138 |
| 2016/0278201 A1 * | 9/2016 | Cheon | H01L 27/3272 |
| 2016/0315125 A1 * | 10/2016 | Kikuchi | G02B 5/201 |
| 2016/0343992 A1 * | 11/2016 | Kim | H01L 51/5281 |
| 2016/0370530 A1 * | 12/2016 | Shimizu | G02B 6/0083 |
| 2017/0036420 A1 * | 2/2017 | Schuch | B32B 7/06 |
| 2017/0045651 A1 * | 2/2017 | Bae | G02F 1/133553 |
| 2017/0053949 A1 * | 2/2017 | Shin | G02F 1/136286 |
| 2017/0059930 A1 * | 3/2017 | Wu | H01L 27/322 |
| 2017/0062770 A1 * | 3/2017 | Jang | H01L 51/56 |
| 2017/0090245 A1 * | 3/2017 | Tsuchiya | G02B 1/14 |
| 2017/0141345 A1 * | 5/2017 | Park | H01L 51/5221 |
| 2017/0176784 A1 * | 6/2017 | Braganza | G02F 1/13718 |
| 2017/0187001 A1 * | 6/2017 | Fang | H01L 51/5265 |
| 2017/0205543 A1 * | 7/2017 | Yim | B32B 7/04 |
| 2017/0214003 A1 * | 7/2017 | Lee | H01L 51/5271 |
| 2017/0222187 A1 * | 8/2017 | Kim | H01L 27/3262 |
| 2017/0229519 A1 * | 8/2017 | Suzuki | G02B 5/20 |
| 2017/0278910 A1 * | 9/2017 | Choi | H01L 27/322 |
| 2017/0315338 A1 * | 11/2017 | Wu | G02B 5/0816 |
| 2017/0331071 A1 * | 11/2017 | Han | B32B 9/045 |
| 2017/0352304 A1 * | 12/2017 | Funatsu | H01L 51/3211 |
| 2018/0011353 A1 * | 1/2018 | Wang | G02B 6/00 |
| 2018/0031886 A1 * | 2/2018 | Lightfoot | G02F 1/13338 |
| 2018/0045866 A1 * | 2/2018 | Chae | G02B 5/207 |
| 2018/0061894 A1 * | 3/2018 | Kim | H01L 27/322 |
| 2018/0062116 A1 * | 3/2018 | Park | H01L 27/322 |
| 2018/0067253 A1 * | 3/2018 | Ting | G02B 6/00 |
| 2018/0088631 A1 * | 3/2018 | Park | G06F 3/041 |
| 2018/0134922 A1 * | 5/2018 | Katami | B32B 7/02 |
| 2018/0136524 A1 * | 5/2018 | Ikegami | G02F 1/133308 |
| 2018/0156951 A1 * | 6/2018 | Baek | G02F 1/133617 |
| 2018/0157098 A1 * | 6/2018 | Choung | G02F 1/133512 |
| 2018/0182816 A1 * | 6/2018 | Kang | H01L 27/323 |
| 2018/0196561 A1 * | 7/2018 | Kim | G06F 3/044 |
| 2018/0210118 A1 * | 7/2018 | Gollier | G09F 19/18 |
| 2018/0219051 A1 * | 8/2018 | Ghosh | H01L 27/3211 |
| 2018/0229497 A1 * | 8/2018 | Darrow | B41J 2/2135 |
| 2018/0269260 A1 * | 9/2018 | Ghosh | H01L 27/322 |
| 2018/0275331 A1 * | 9/2018 | Harada | G02F 1/133615 |
| 2018/0304607 A1 * | 10/2018 | Ohman | B32B 7/12 |
| 2018/0315805 A1 * | 11/2018 | Liu | H01L 27/3244 |
| 2018/0355181 A1 * | 12/2018 | Yoon | C09B 69/106 |
| 2018/0358586 A1 * | 12/2018 | Harkema | H01L 51/5268 |

FOREIGN PATENT DOCUMENTS

| | | |
|---|---|---|
| KR | 10-2015-0087655 A | 7/2015 |
| KR | 10-2015-0096139 A | 8/2015 |

\* cited by examiner

COVER UNIT AND DISPLAY DEVICE HAVING THE SAME

CROSS-REFERENCE TO RELATED APPLICATION

This U.S. non-provisional patent application claims priority under 35 U.S.C. § 119 of Korean Patent Applications Nos. 10-2016-0058378, filed on May 12, 2016 and 10-2016-0068373, filed on Jun. 1, 2016, the disclosures of which are hereby incorporated by reference in their entirety.

BACKGROUND

1. Field of Disclosure

The present disclosure relates to a cover unit and a display device having the same. More particularly, the present disclosure relates to a cover unit having improved manufacturing yield and a display device having the cover unit.

2. Description of the Related Art

A cover unit of a display device, such as a television, a laptop computer, a tablet personal computer (PC), and a smartphone, is placed on the outside of the display device. The cover unit can provide a color to an area corresponding to a non-display area surrounding a display area. As the design of a display device becomes as important as the performance, various structures of a cover unit and processes to manufacture the cover unit to implement various colors and visual effects have been developed.

SUMMARY

The present disclosure provides a cover unit having improved manufacturing yield and a display device having the cover unit.

According to one embodiment, a display device includes a cover unit and a display panel disposed on the cover unit. The cover unit includes a first base member disposed on the display panel and including a first area and a second area when viewed in a plan view, a pattern layer disposed between the first base member and the display panel, a color layer disposed between the first base member and the pattern layer, and a reflective layer disposed between the display panel and the pattern layer.

The reflective layer may be overlapped with the color layer when viewed in a plan view.

The cover unit may further include a second base member disposed between the color layer and the pattern layer.

The second base member may not be overlapped with the second area when viewed in a plan view.

The color layer may include a primer layer disposed on the second base member and a color implementing layer disposed on the primer layer.

The cover unit may further include a second base member disposed between the color layer and the first base member.

The display panel may include a display area overlapped with the second area and displaying an image and a non-display area overlapped with the first area and not displaying the image. The reflective layer and the color layer may be overlapped with the first area when viewed in a plan view and may not be overlapped with the second area.

The pattern layer may further include a pattern disposed on one surface of the pattern layer that makes contact with the reflective layer.

The cover unit may further include a cover layer covering the pattern layer, and the pattern may be overlapped with the first area and the second area when viewed in a plan view.

A portion of the pattern overlapped with the second area may be flat.

The pattern maybe disposed only on a portion of the pattern layer that is overlapped with the first area when viewed in a plan view.

The pattern layer may not be overlapped with the second area when viewed in a plan view.

When the first area has a first color when viewed in a plan view, the reflective layer may have a second color, and the color layer may have a third color. When the first area has a fourth color that is different from the first color when viewed in a plan view, the reflective layer may have the second color, and the color layer may have a fifth color that is different from the third color.

The cover unit may further include a shielding layer disposed between the reflective layer and the display panel, and the shielding layer may cover the reflective layer.

The cover unit may further include an adhesive layer disposed between the color layer and the first base member.

The adhesive layer may be overlapped with the first area and may not be overlapped with the second area when viewed in a plan view.

The reflective layer may impart a metallic effect.

The display device may further include a cover member disposed on a rear side of the display panel. The cover member may include a third base member, a second reflective layer, and a second color layer.

According to one embodiment, a cover unit includes a first base member, a pattern layer disposed on the first base member, a reflective layer disposed on the pattern layer, and a color layer disposed between the first base member and the pattern layer.

The cover unit may further include: an adhesive layer disposed between the color layer and the first base member; a second base member disposed between the color layer and the pattern layer or disposed between the color layer and the first base member; and a shielding layer covering the reflective layer.

The cover unit may further include a cover layer covering the pattern layer.

The first base member may include a first area and a second area when viewed in a plan view, and each of the reflective layer and the color layer may be overlapped with the first area and may not be overlapped with the second area when viewed in a plan view.

The reflective layer may impart a metallic effect.

The reflective layer may have a second color, and the color layer has a third color. The first area may implement a first color when viewed in a plan view by optically combining the second color of the reflective layer and the third color of the color layer.

The reflective layer, the color layer, and the first base member may be overlapped with each other when viewed in a plan view.

The cover unit may further include a second base member disposed between the color layer and the reflective layer, and the color layer may directly make contact with one surface of the second base member.

A method for forming a cover unit include: forming a pattern layer including a pattern on a first surface of a base member by a roll-to-roll imprint process; forming a reflective layer on the pattern layer by a depositing process; forming a color layer on a second surface of the base member by a roll-to-roll process; and forming an adhesive layer to cover the color layer.

BRIEF DESCRIPTION OF THE DRAWINGS

The above and advantages of the present disclosure will become readily apparent by reference to the following detailed description in conjunction with the accompanying drawings wherein.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness. Like numerals refer to like elements throughout.

Hereinafter, the present disclosure will be explained in detail with reference to the accompanying drawings.

Figure 1:
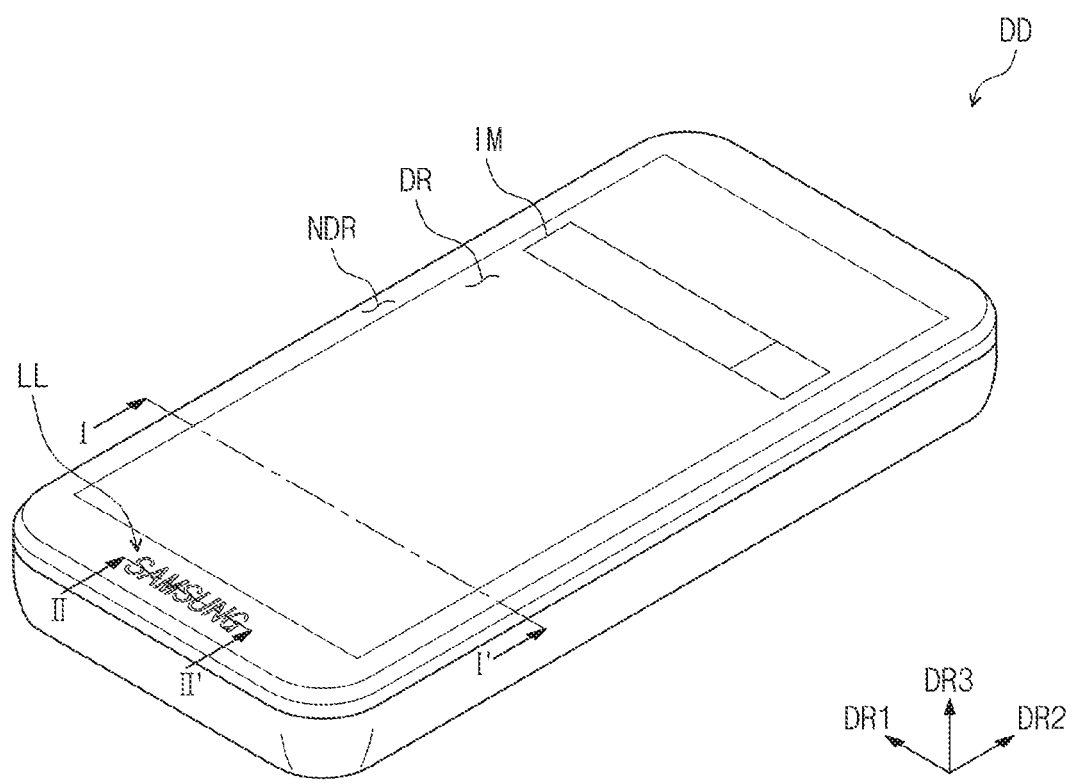
FIG. 1 is a perspective view showing a display device, according to one exemplary embodiment of the present disclosure.

FIG. 1 is a perspective view showing a display device DD, according to one exemplary embodiment of the present disclosure. For example, the display device DD is a flat mobile terminal. However, the display device DD may be applied to various display devices, such as a curved display device, a bendable display device, a rollable display device, a foldable display device, a stretchable display device, etc., according to some embodiment. The display device DD according to other exemplary embodiments may be applied to a large-sized electronic item such as a television set and an outdoor billboard and a small and medium-sized electronic item such as a personal computer, a notebook computer, a personal digital assistant, a car navigation unit, a game unit, a mobile electronic device, a wrist-type electronic device, and a camera. However, it is understood that the display DD can be applied to various other electronic items and applications and should not be limited to or by the examples listed herein.

The display device DD includes a plurality of areas distinct from each other on a display surface. For example, the display device DD includes a display area DR displaying an image IM and a non-display area NDR disposed adjacent to the display area DR. The display surface on which the image IM is displayed is substantially parallel to a surface defined by a first direction DR1 and a second direction DR2. A third direction DR3 indicates a normal direction of the display surface. The third direction DR3 may serve as a reference axis to distinct front and rear surfaces of each member of the display device DA. In the following descriptions, the surface defined by the first and second directions DR1 and DR2 may be referred to as a flat surface, and an expression of "when viewed in a plan view" may mean "when viewed in the third direction DR3".

Figure 2:
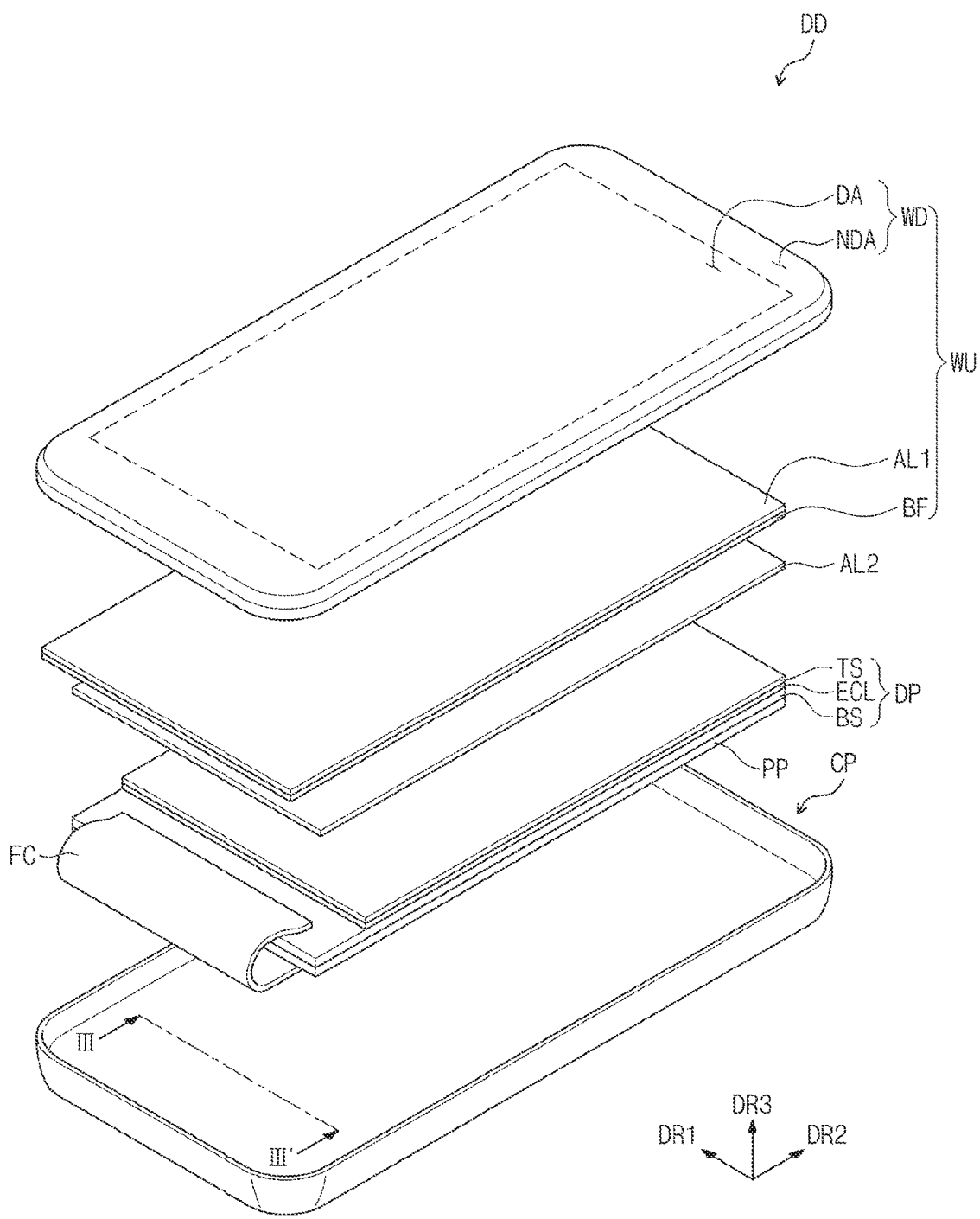
FIG. 2 is an exploded perspective view showing the display device shown in FIG. 1.
Figure 3:
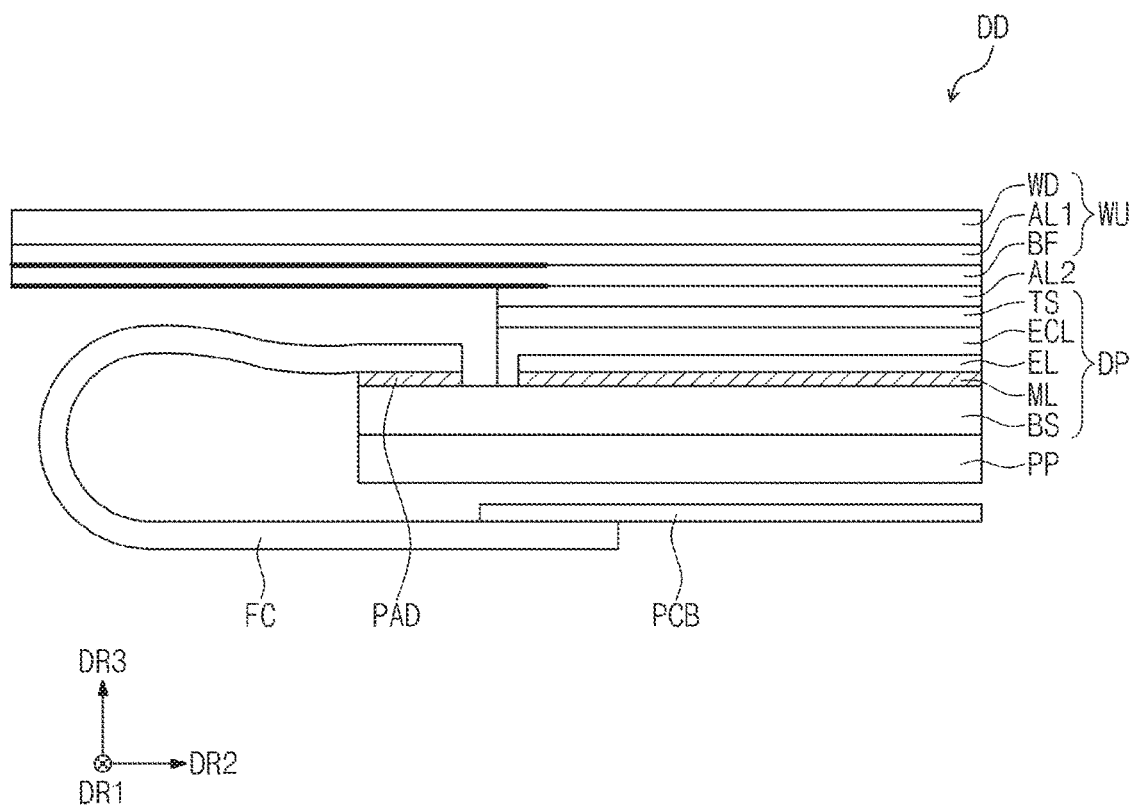
FIG. 3 is a cross-sectional view showing the display device shown in FIG. 1.

FIG. 2 is an exploded perspective view showing the display device DD shown in FIG. 1, and FIG. 3 is a cross-sectional view showing the display device DD shown in FIG. 1.

Referring to FIGS. 2 and 3, the display device DD includes a display panel DP, a cover unit WU, and a cover member CP. The display panel DP includes a display area overlapped with the display area DR shown in FIG. 1 of the display device DD and a non-display area overlapped with the non-display area NDR shown in FIG. 1 of the display device DD. The display panel DP provides an image corresponding to image data input through the display area. The display panel DP may be, but not limited to, an organic light emitting display panel, a liquid crystal display panel, a plasma display panel, an electrophoretic display panel, or an electrowetting display panel. In the present exemplary embodiment, the organic light emitting display panel will be described as an example of the display panel DP without deviating from the scope of the present disclosure.

The display panel DP includes a base substrate BS, a circuit layer ML, an organic light emitting element layer EL, an encapsulation layer ECL, a pad part PAD, and a touch sensing unit TS. The base substrate BS includes at least one of a glass substrate, a sapphire substrate, and a plastic substrate. The circuit layer ML, the organic light emitting element layer EL, the encapsulation layer ECL, the pad part PAD, and the touch sensing unit TS are sequentially stacked on the base substrate BS. The circuit layer ML includes a plurality of signal lines and a plurality of electronic devices that are arranged on the display panel DP. For example, the circuit layer ML includes thin film transistors corresponding to gate lines, data lines, and pixels, respectively.

The organic light emitting element layer EL generates a light having a color corresponding to a light emitting material included in the organic light emitting element layer EL. The color emitted by the organic light emitting element layer EL may include red, green, blue, and white colors, but it should not be limited thereto or thereby.

The encapsulation layer ECL includes a thin film encapsulation layer (TFE) configured to include a plurality of inorganic thin film layers and a plurality of organic thin film layers. The encapsulation layer ECL covers the organic light emitting element layer EL and blocks air and moisture to protect the organic light emitting element layer EL. In another embodiment, the encapsulation layer ECL may be replaced with an encapsulation substrate. The encapsulation layer ECL is disposed spaced apart from the base substrate BS such that the organic light emitting element layer EL is disposed between the encapsulation layer ECL and the base substrate BS. The encapsulation layer ECL and the base substrate BS are coupled to each other by a sealant arranged along an edge of the base substrate BS.

The touch sensing unit TS is disposed on the encapsulation layer ECL. The position of the touch sensing unit TS should not be limited thereto or thereby. For example, the touch sensing unit TS may be disposed between the organic light emitting element layer EL and the encapsulation layer ECL or between the base substrate BS and the circuit layer ML. In another example, the touch sensing unit TS may be included in the cover unit WU other than the display panel DP.

The touch sensing unit TS obtains coordinate information of a touch input position. The touch sensing unit TS may be any of a resistive film type, an electrostatic capacitive type, and an electromagnetic induction type depending on the touch sensing mechanism. In the electrostatic capacitive type touch sensing unit, the touch sensing unit TS may obtain the coordinate information of the touch input position using two kinds of sensor crossing each other in a self-capacitance manner or a mutual capacitance manner. In the present exemplary embodiment, the electrostatic capacitive type touch sensing unit will be described as an example of the touch sensing unit IT without deviating from the scope of the present disclosure.

According to one embodiment, the display panel DP may include an optical member (not shown). The optical member may be disposed above the touch sensing unit TS, but it should not be limited thereto or thereby. The optical member may include at least one of a retardation plate and a polarizing plate. In the case that the optical member includes both the retardation plate and the polarizing plate, the polarizing plate is disposed on the retardation plate. An external light incident to the cover unit WU can be linearly polarized while passing through the polarizing plate. The linearly-polarized incident light can be reflected after passing through the retardation plate and incident to the polarizing plate after passing through the retardation plate again. The linearly-polarized incident light can be circularly polarized to have a phase difference of about 45 degrees while passing through the retardation plate to change the phase of the linearly-polarized incident light. As a result, the external light may not pass through the polarizing plate after passing again through the retardation plate, and the external light becomes extinct. For example, a light that is right circularly polarized while passing through the retardation plate can be reflected and changed to a left circularly polarized light, and the right circularly polarized light can destructively interfere with the left circularly polarized light. Accordingly, a reflectance of the display device DD with respect to the external light may be reduced.

The pad part PAD includes pads corresponding to and electrically connected to a plurality of signal lines that are electrically connected to the pixels in a one-to-one correspondence. The pad part PAD is electrically connected to a flexible printed circuit board FC.

The flexible printed circuit board FC is attached to one end of the display panel DP and bent to a rear surface of the display panel DP. The flexible printed circuit board FC is electrically connected to the pad part PAD to receive signals from a driving printed circuit board PCB to drive the display panel DP. In addition, the flexible circuit board FC may apply the signals to the display panel DP. A data driving chip (not shown) may be mounted on one surface of the flexible printed circuit board FC. The data driving chip may generate data signals applied to the data lines of the display panel DP in response to an external signal.

The driving printed circuit board PCB is disposed on the rear surface of the display panel DP. The driving printed circuit board PCB is electrically connected to the display panel DP through the flexible printed circuit board FC. The driving printed circuit board PCB may apply an image signal to display an image on the display panel DP and a control signal to control a drive of the display panel DP.

The driving printed circuit board PCB includes a base substrate, and the base substrate may be a flexible printed circuit board. In this case, the base substrate may be, but not limited to, a flexible plastic substrate formed of polyimide or polyester.

A protective member PP is disposed between the display panel DP and the driving printed circuit board PCB. The protective member PP may include at least one of a buffer member and a heat discharge member. The buffer member includes a material having high impact absorption. For example, the buffer member includes a polymer resin such as polyurethane, polycarbonate, polypropylene, and polyethylene, or a sponge formed by foam molding, a rubber solution, an urethane-based material, or an acrylic-based material. The heat discharge member includes at least one of graphite, copper (Cu), and aluminum (Al) that exhibit superior heat discharge characteristics, but it should not be limited thereto or thereby. The heat discharge member may improve the heat discharge characteristics and may also have electromagnetic shielding characteristics and/or electromagnetic absorbing characteristics.

The cover unit WU is disposed above the display panel DP. The cover unit WU and the display panel DP are attached to each other by an adhesive layer AL2. The adhesive layer AL2 may be, but is not limited to, an optically clear adhesive film or a layer made of an optical clear resin. The adhesive layer AL2 may be omitted according to some embodiments of the present disclosure. In this case, the cover unit WU and the display panel DP may make contact with each other without the adhesive layer AL2 and are disposed spaced apart from each other.

The cover unit WU includes a first base member WD, an adhesive layer AL1, and a second base member BF. Referring to FIG. 2, the first base member WD has a display area DA overlapped with the display area DR of the display device DD and a non-display area NDA overlapped with the non-display area NDR of the display device DD shown in FIG. 1.

The first base member WD may include at least one of a silicon substrate, a glass substrate, a sapphire substrate, and a plastic film, but it should not be limited thereto or thereby. The second base member BF may be a transparent film through which light transmits. The second base member BF may not completely transmit light. For example, the light transmittance of the second base member BF may be lower than about 100%. The second base member BF may include one or more of synthetic resins such as PET, PVC, PP, PE, PC, and PMMA, but it should not be limited thereto or thereby.

The adhesive layer AL1 is disposed between the first base member WD and the second base member BF. and the first base member WD and the second base member BF are attached to each other by the adhesive layer AL1. The adhesive layer AL1 may include an optically clear adhesive film or a layer made of an optical clear resin. In addition, the adhesive layer AL1 may include a hard coating layer (not shown).

The cover member CP accommodates the display panel DP and is coupled to the cover unit WU. The cover member CP is formed by assembling plural parts or is integrally formed in a single unitary and individual unit, for example, by an injection molding method.

Figure 4:
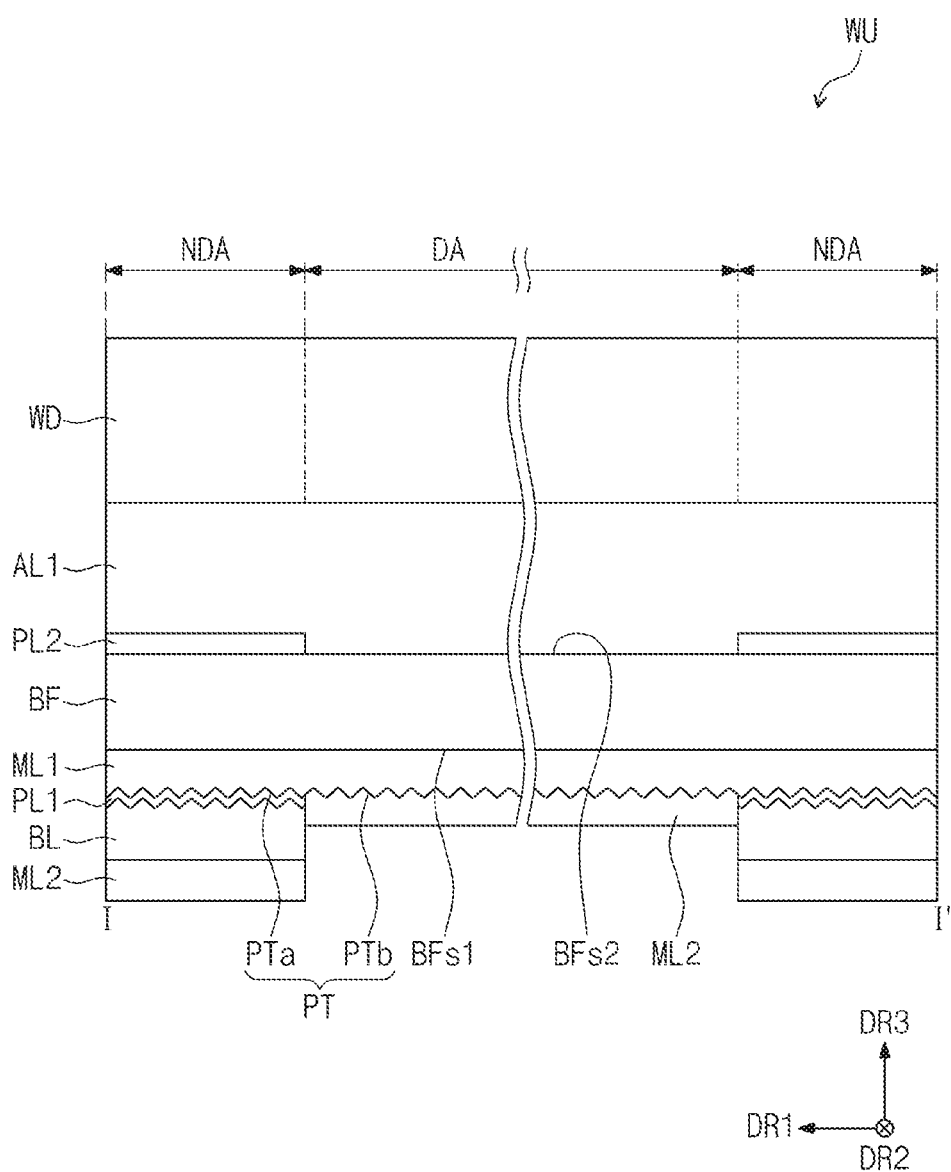
FIG. 4 is a cross-sectional view taken along a line I-I' of FIG. 1, according to one embodiment.

FIG. 4 is a cross-sectional view taken along a line I-I' of FIG. 1, according to one embodiment. FIG. 4 shows only the cover unit WU, and the display panel DP and the cover member CP are omitted.

Referring to FIG. 4, the cover unit WU includes the first base member WD, the adhesive layer AL1, the second base member BF, a reflective layer PL1, a color layer PL2, a pattern layer ML1, a cover layer ML2, and a shielding layer BL. The first base member WD includes a first area NDA and a second area DA defined on a plane. The first area NDA is overlapped with the non-display area NDR of FIG. 1 when viewed in a plan view, and the second area DA is overlapped with the display area DR of FIG. 1 when viewed in a plan view.

The second base member BF is disposed under the first base member WD. That is, the second base member BF is disposed between the first base member WD and the display panel DP shown in FIG. 2. The second base member BF includes a first surface BFs1 and a second surface BFs2 facing each other. The second surface BFs2 is disposed between the first base member WD and the first surface BFs1.

The pattern layer ML1 is disposed under the first surface BFs1 of the second base member BF. The pattern layer ML1 may be directly disposed on the first surface BFs1 of the second base member BF, or an intermediate layer may exist between the pattern layer ML1 and the first surface BFs1 of the second base memory BF. The pattern layer ML1 may include a light-curable material or a heat-curable material. For example, the pattern layer ML1 includes an ultraviolet ray-curable resin.

One surface of the pattern layer ML1 may contact with the second base member BF, and a pattern PT is formed on the other surface of the pattern layer ML1. The pattern PT includes a first pattern PTa overlapped with the first area NDA and a second pattern PTb overlapped with the second area DA when viewed in the third direction DR3.

The first pattern PTa diffusively reflects the light incident from the outside. FIG. 4 shows the first pattern PTa having a prism shape. However, it is understood that the first pattern PTa may have various patterns, and the shape of the first pattern PTa should not be limited to the prism shape. For example, the first pattern PTa is a three-dimensional pattern such as a fine hair line pattern, a wave pattern.

The reflective layer PL1 is disposed under the first pattern PTa. The reflective layer PL1 is disposed to overlap with the first area NDA when viewed in a plan view. The reflective layer PL1 may include a reflective material. The reflective layer PL1 can reflect or absorb the light incident from the outside. The reflective layer PL1 may have a layer structure in which one or more layers are stacked. For example, the reflective layer PL1 includes a first layer including indium and a second layer including titanium dioxide, but it should not be limited thereto or thereby.

The shielding layer BL is disposed under the reflective layer PL1. The shielding layer BL may have a black color, but it should not be limited thereto or thereby. The shielding layer BL is disposed under the reflective layer PL1 to exhibit a color of a portion of the cover unit WU more clearly.

The shielding layer BL may be formed on a lower surface of the reflective layer PL1 through a printing process, but it should not be limited thereto or thereby. The shielding layer BL may be implemented by a predetermined auxiliary member. In this case, the shielding layer BL may be attached to a lower portion of the reflective layer PL1. In FIG. 4, the cover unit WU is shown to include the shielding layer BL, but the shielding layer BL may be omitted according to other embodiments.

The cover layer ML2 is disposed under the pattern layer ML1. The cover layer ML2 may include substantially the same material as the pattern layer ML1. For example, the cover layer ML2 includes an ultraviolet ray-curable resin. The cover layer ML2 may also be attached to the second pattern PTb of the pattern layer ML1. Accordingly, the light is not diffusively reflected by the second pattern PTb overlapped with the second area DA when viewed in a plan view.

In FIG. 4, a portion of the cover layer ML2 is disposed under the shielding layer BL, and the other portion of the cover layer ML2 is disposed under the pattern layer ML1. However, the cover layer ML2 may be disposed only under the second pattern PTb of the pattern layer ML1. According to another embodiment, the cover layer ML2 may be disposed to cover the reflective layer PL1 and the second pattern PTb, and the shielding layer BL may be disposed under the cover layer ML2 overlapping only the portion of the cover layer ML2 in the first area NDA when viewed in a plan view.

The color layer PL2 is disposed above the second surface BFs2 of the second base member BF. The color layer PL2 is disposed between the first base member WD and the second base member BF. Accordingly, the reflective layer PL1 and the color layer PL2 face each other such that the second base member BF is disposed between the reflective layer PL1 and the color layer PL2. The color layer PL2 may be directly disposed on the second base member BF. The color layer PL2 may be overlapped with the first area NDA and the reflective layer PL1 when viewed in a plan view.

The color layer PL2 has a light transmittance. Thus, the light incident from the outside passes through the color layer PL2 and is reflected by the reflective layer PL1. Accordingly, a user may recognize a color that optically combines a color of the reflective layer PL1 and a color of the color layer PL2.

The color layer PL2 may include a dye having a predetermined color and a permeable material. The light transmittance of the color layer PL2 may be controlled by adjusting a concentration of the dye and the permeable material.

The cover unit WU may have various colors by changing the color of the color layer PL2. To implement various colors in the portion of the cover unit WU corresponding to the first area NDA, compositions included in the reflective layer PL1 and/or the color layer PL2 may be changed. According to the present exemplary embodiment, the various colors can be implemented by changing the color layer PL2 to include different materials in accordance with the color implemented by the cover unit WU. In this case, the reflective layer PL1 may serve as a common layer, and the color and/or composition of the reflective layer PL1 may not change. Instead, the reflective layer PL1 may be used to impart a special visual effect, for example, a metallic effect in the portion of the cover unit WU corresponding to the first area NDA. The color of the cover unit WU may be changed in the portion of the cover unit WU corresponding to the first area NDA by changing the color of the color layer PL2. The color of the cover unit WU may be determined by optical combination of the variable color of the color layer PL2 and the intrinsic color of the reflective layer PL1 that is determined by the optical characteristic of the material(s) forming the reflective layer PL1.

According to the present exemplary embodiment, the material of the reflective layer PL1 is not related to the color of the portion of the cover unit WU. Accordingly, various colors of the cover unit WU may be implemented only by changing the color of the color layer PL2. That is, processes to impart a special visual effect and implement a specific color of the cover unit WU are simplified and separated, and thus a variation in color between cover units representing the same color can be reduced. Thus, the product manufacturing yield may be improved.

Figure 5:
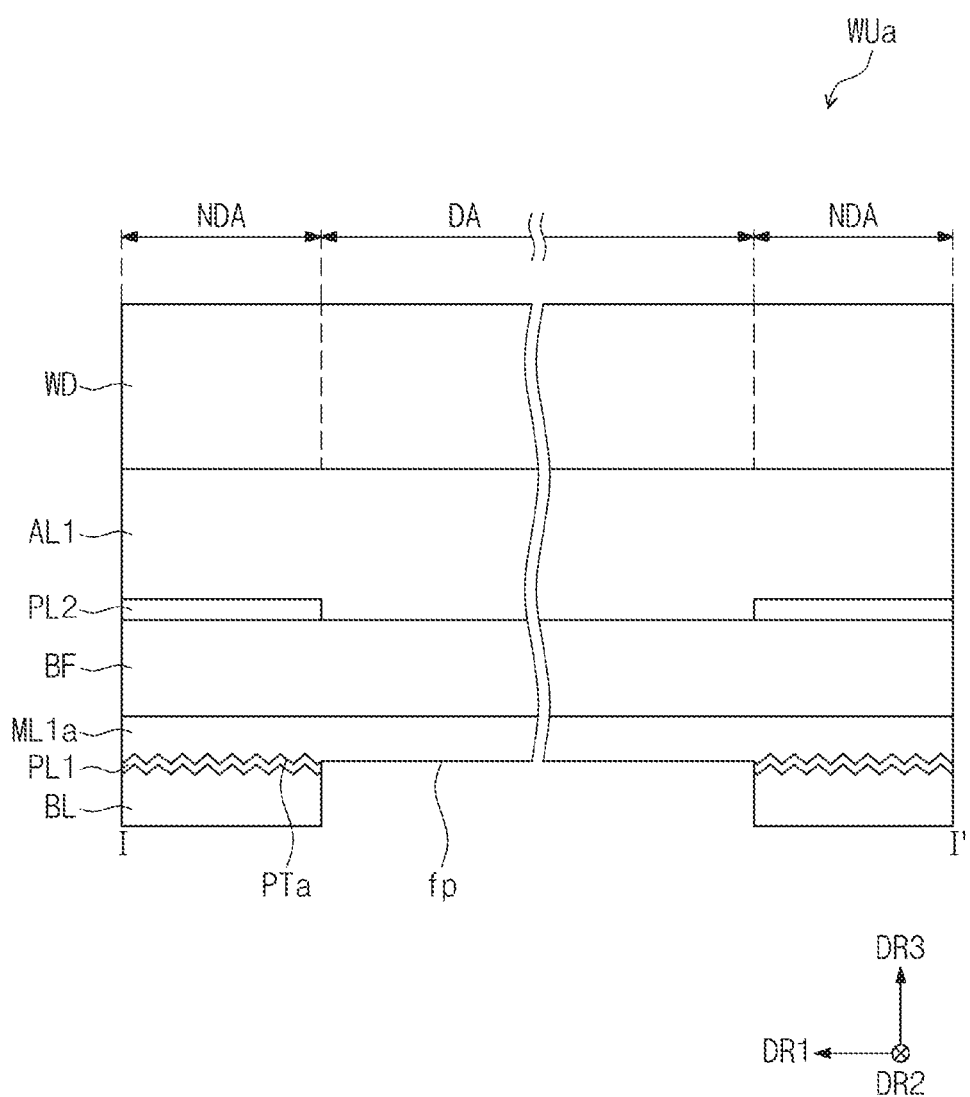
FIG. 5 is a cross-sectional view taken along a line I-I' of FIG. 1, according to one embodiment.

FIG. 5 is a cross-sectional view taken along a line I-I' of FIG. 1, according to one embodiment. A cover unit WUa shown in FIG. 5 may have the same structure and function as those of the cover unit WU shown in FIG. 4 except for a shape of a pattern layer ML1a.

Referring to FIG. 5, the reflective layer PL1 having a pattern PTa is disposed on one surface of the pattern layer ML1a. The pattern PTa is overlapped only with the first area NDA when viewed in a plan view. The surface fp of the pattern layer ML1a that is overlapped with the second area DA may be flat. Accordingly, the cover layer ML2 shown in FIG. 4 that flattens the pattern PTb of the pattern layer ML1a in an area overlapped with the second area DA may be omitted.

Figure 6:
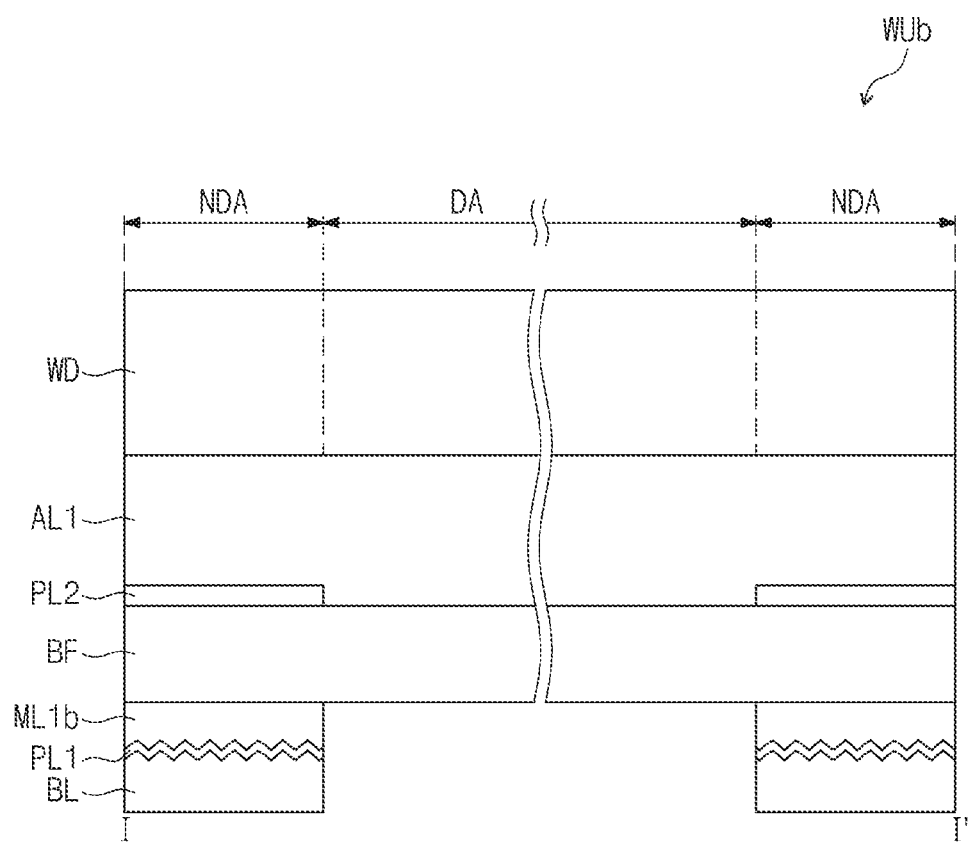
FIG. 6 is a cross-sectional view taken along a line I-I' of FIG. 1, according to one embodiment.
Figure 6:
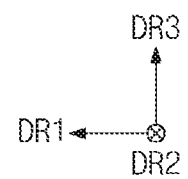

FIG. 6 is a cross-sectional view taken along a line I-I' of FIG. 1, according to one embodiment. A cover unit WUb shown in FIG. 6 may have the same structure and function as those of the cover unit WU shown in FIG. 4 except for a shape of a pattern layer ML1b. The pattern layer ML1 shown in FIG. 4 is overlapped with the first and second areas NDA and DA when viewed in a plan view, but the pattern layer ML1b shown in FIG. 6 is overlapped with the first area NDA and not overlapped with the second area DA when viewed in a plan view. Accordingly, the transmittance of the light provided from the display panel DP shown in FIG. 2 may be further improved.

Figure 7:
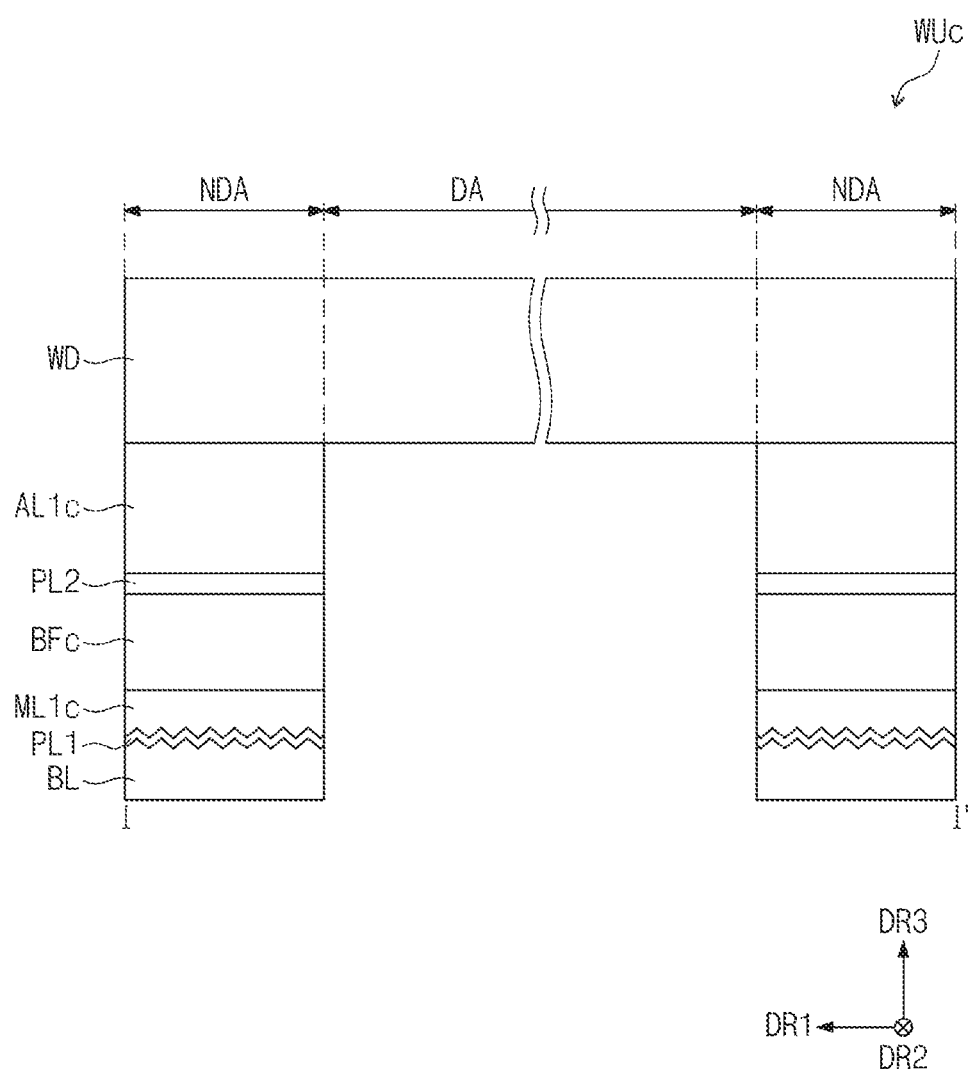
FIG. 7 is a cross-sectional view taken along a line I-I' of FIG. 1, according to one embodiment.

FIG. 7 is a cross-sectional view taken along a line I-I' of FIG. 1, according to one embodiment. A cover unit WUc shown in FIG. 7 may have the same structure and function as those of the cover unit WU shown in FIG. 4 except for shapes of a pattern layer ML1c, a second base member BFc, and an adhesive layer AL1c. Each of the pattern layer ML1c, the second base member BFc, and the adhesive layer AL1c shown in FIG. 7 is overlapped with the first area NDA and not overlapped with the second area DA when viewed in a plan view. Accordingly, the transmittance of the light provided from the display panel DP shown in FIG. 2 may be further improved.

Figure 8:
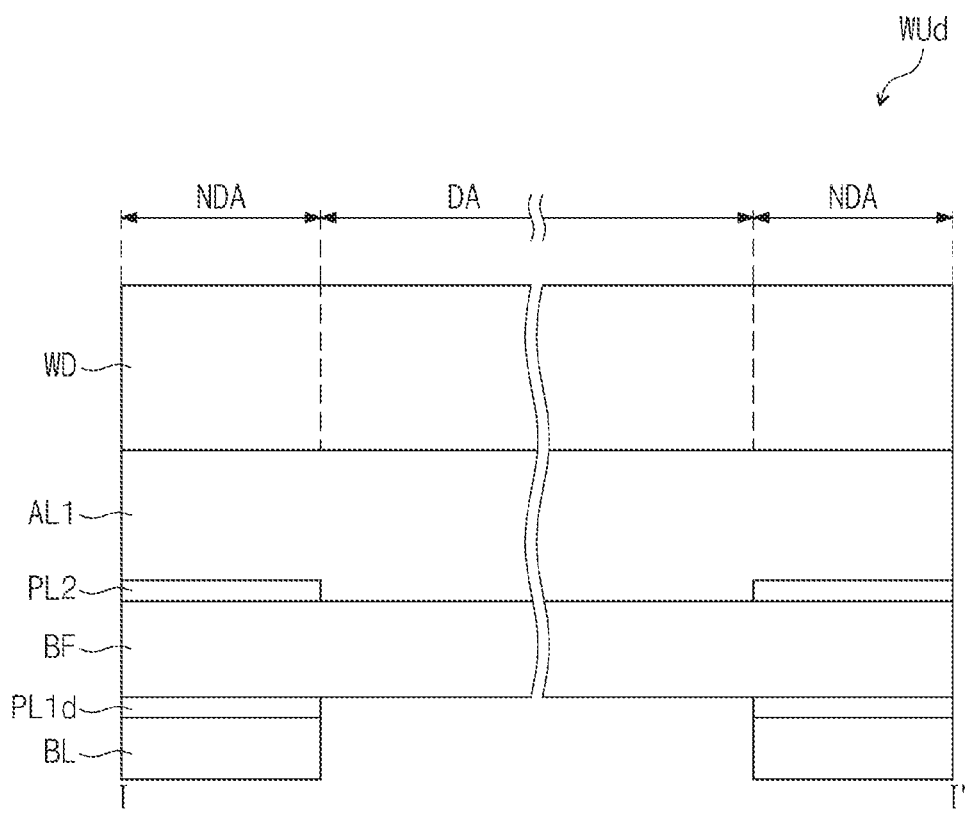
FIG. 8 is a cross-sectional view taken along a line I-I' of FIG. 1, according to one embodiment.

FIG. 8 is a cross-sectional view taken along a line I-I' of FIG. 1, according to one embodiment. A cover unit WUd shown in FIG. 8 may not include the pattern layer ML1 and the cover layer ML2 shown in FIG. 4 when compared with the cover unit WU shown in FIG. 4. According to the present exemplary embodiment, a thickness of the cover unit WUd may be reduced compared with the cover unit WU described with reference to FIG. 4, and the transmittance of the light provided from the display panel DP shown in FIG. 2 may be further improved.

Figure 9:
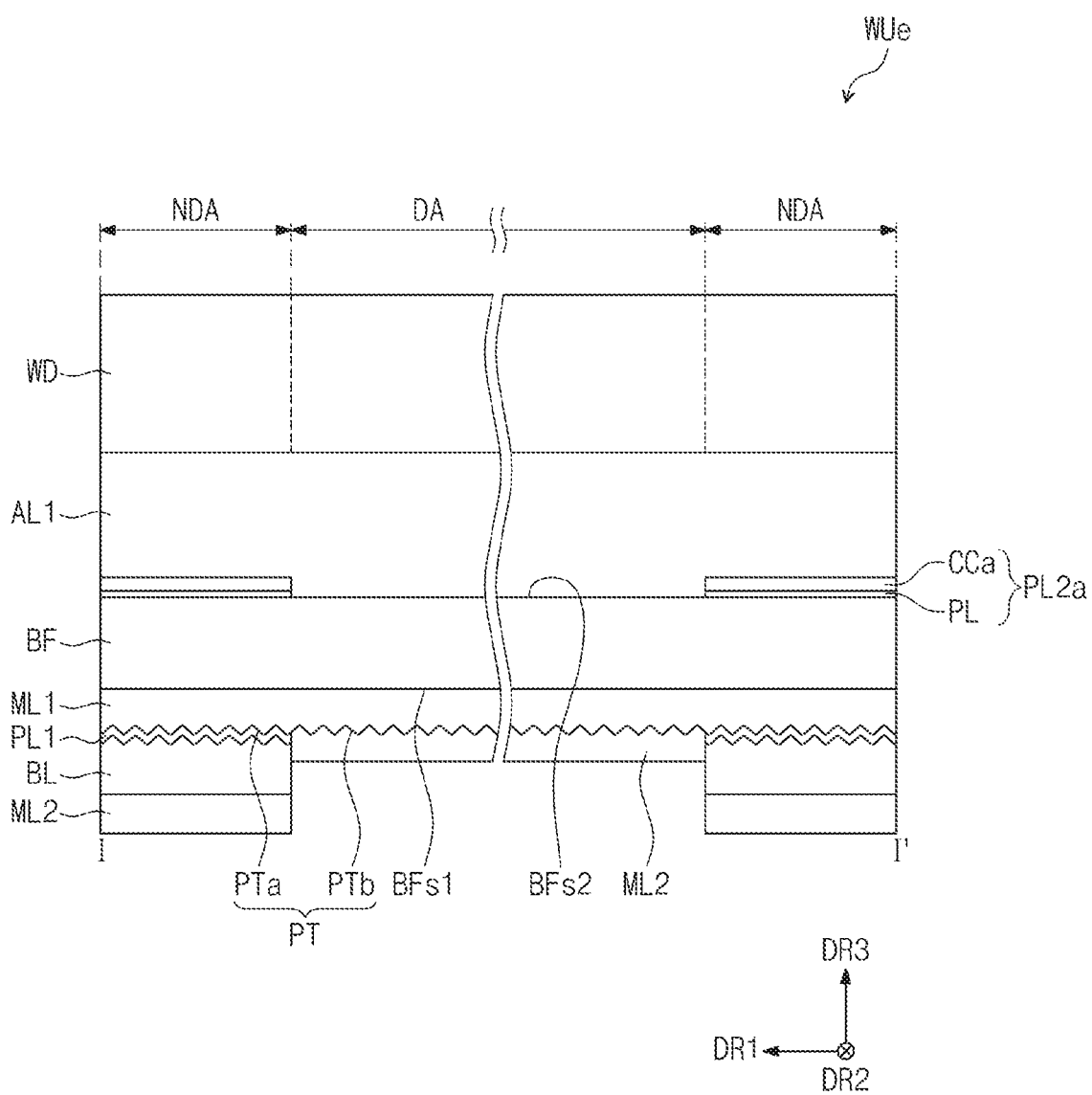
FIG. 9 is a cross-sectional view taken along a line I-I' of FIG. 1, according to one embodiment.

FIG. 9 is a cross-sectional view taken along a line I-I' of FIG. 1, according to one embodiment. A cover unit WUe shown in FIG. 9 may have the same structure and function as those of the cover unit WU shown in FIG. 4 except for a color layer PL2a. Referring to FIG. 9, the color layer PL2a may include a primer layer PL and a color implementing layer CCa. The primer layer PL is disposed on the second base member BF, and the color implementing layer CCa is disposed on the primer layer PL. An adhesive force between the color implementing layer CCa and the second base member BF may be further improved by the primer layer PL.

Figure 10:
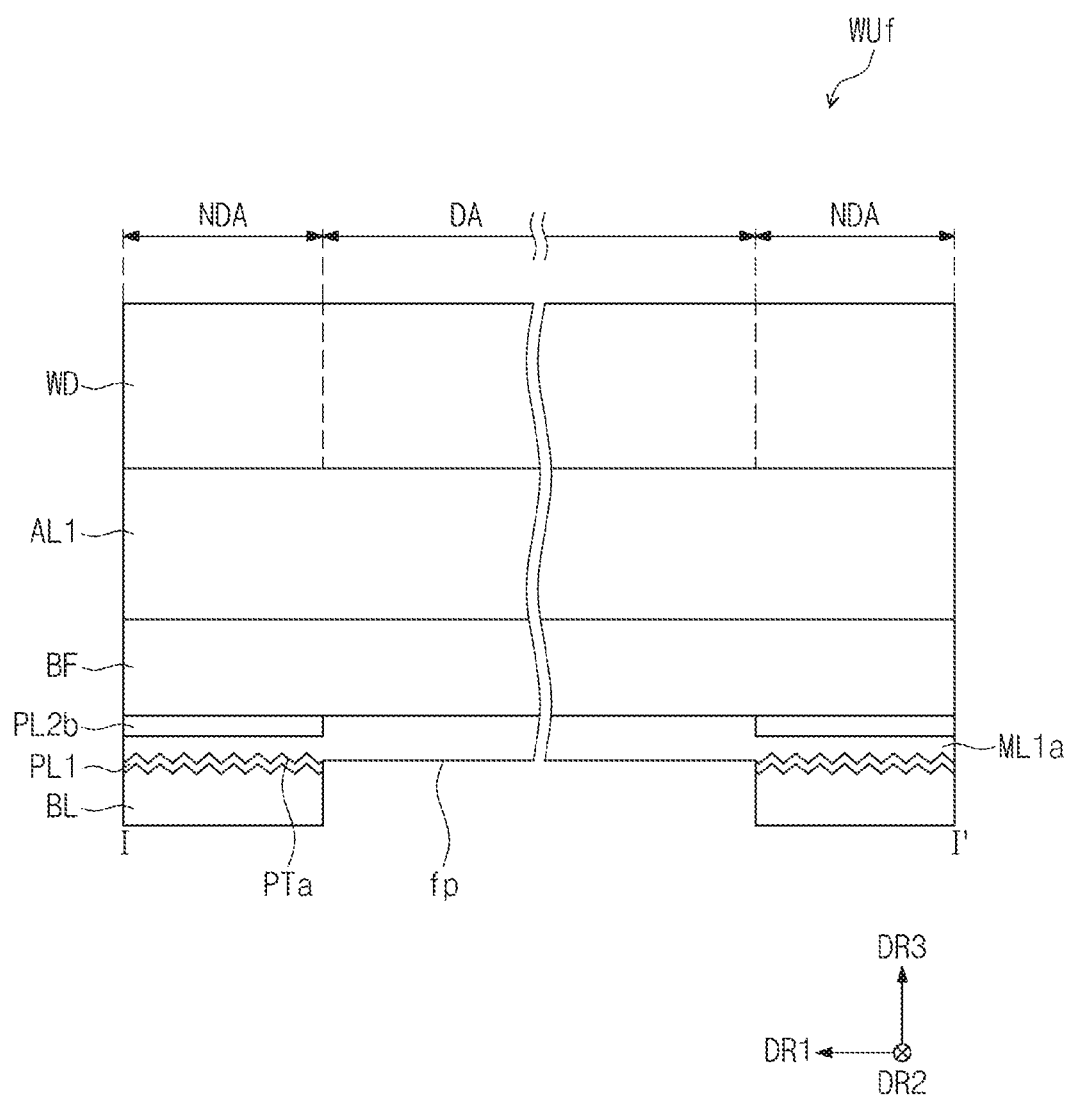
FIG. 10 is a cross-sectional view taken along a line I-I' of FIG. 1, according to one embodiment.

FIG. 10 is a cross-sectional view taken along a line I-I' of FIG. 1, according to one embodiment. A cover unit WUf shown in FIG. 10 may have the same structure and function as those of the cover unit WUa shown in FIG. 5 except for a position of a color layer PL2b. According to the present exemplary embodiment, the color layer PL2b is disposed between the pattern layer ML1a and the second base member BF. That is, the color layer PL2b and the reflective layer PL1 may be disposed on the same surface of the second base member BF. The cover unit WUf shown in FIG. 10 may have structures in which the positions of the second base member BF and the color layer PL2 (or PL2a) are changed with respect to each other in the cover units WU, WUa, WUb, WUc, WUd, and WUe described with reference to FIGS. 4 to 9.

Figure 11:
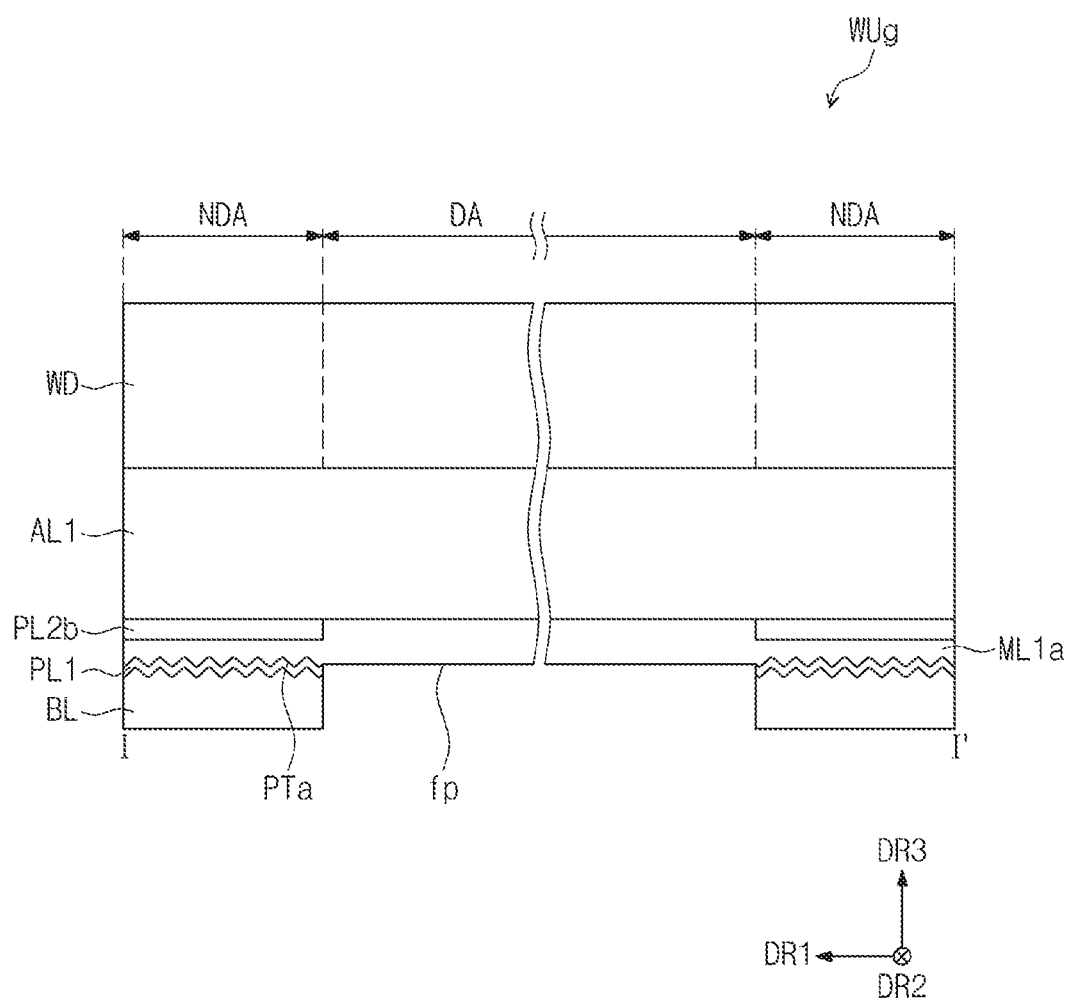
FIG. 11 is a cross-sectional view taken along a line I-I' of FIG. 1, according to one embodiment.

FIG. 11 is a cross-sectional view taken along a line I-I' of FIG. 1, according to one embodiment. A cover unit WUg shown in FIG. 11 does not include the second base member BF when compared with the cover unit WUf shown in FIG. 10. In this case, the cover unit WUg may be thinner, and the flexibility of the cover unit WUg may be improved. The cover unit WUg shown in FIG. 11 may have structures in which the positions of the second base member BF and the color layer PL2 (or PL2a) are changed with respect to each other, or the second base member BF is omitted in the cover units WU, WUa, WUb, WUc, WUd, and WUe described with reference to FIGS. 4 to 9.

Figure 12:
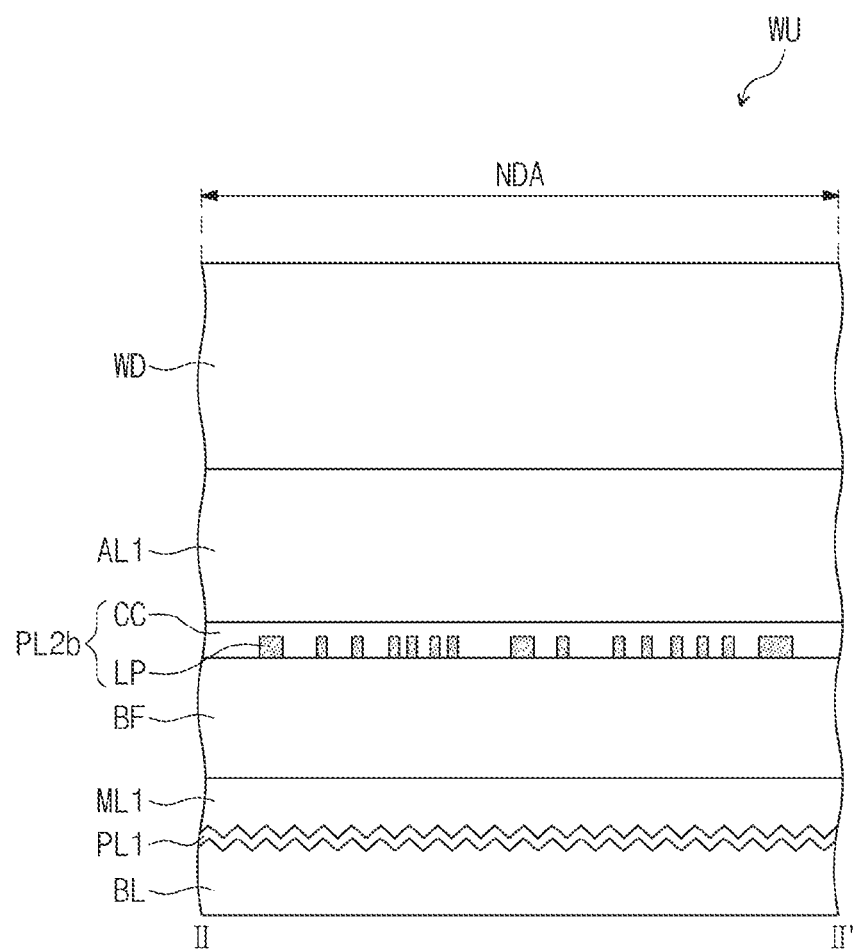
FIG. 12 is a cross-sectional view taken along a line II-II' of FIG. 1, according to one embodiment.

FIG. 12 is a cross-sectional view taken along a line II-II' of FIG. 1, according to one embodiment. The cross-sectional view shown in FIG. 12 is taken along an area in which a logo LL is formed. FIG. 12 shows only the cover unit WU, and the display panel DP and the cover member CP are omitted.

Referring to FIGS. 1 and 12, a color layer PL2b includes a logo layer LP and a color implementation layer CC. The logo layer LP is disposed on the second base member BF, and the color implementation layer CC covers the logo layer LP and implements the color of the cover unit WU in the first area NDA.

The logo layer LP may be disposed on the second base member BF using a printing method, but it should not be limited thereto or thereby. The logo layer LP may be disposed at various layer and/or positions in the first area NDA of the cover unit WU. For example, the logo layer LP may be disposed between the first base member WD and the adhesive layer AL1.

Referring to FIG. 2, the cover units WU and WUa to WUg shown in FIGS. 4 to 12 are disposed in the third direction DR3 in which the display panel DP provides an image. Accordingly, the image is displayed by the display panel DP to the user after passing through the cover units WU and WUa to WUg, respectively.

Figure 13:
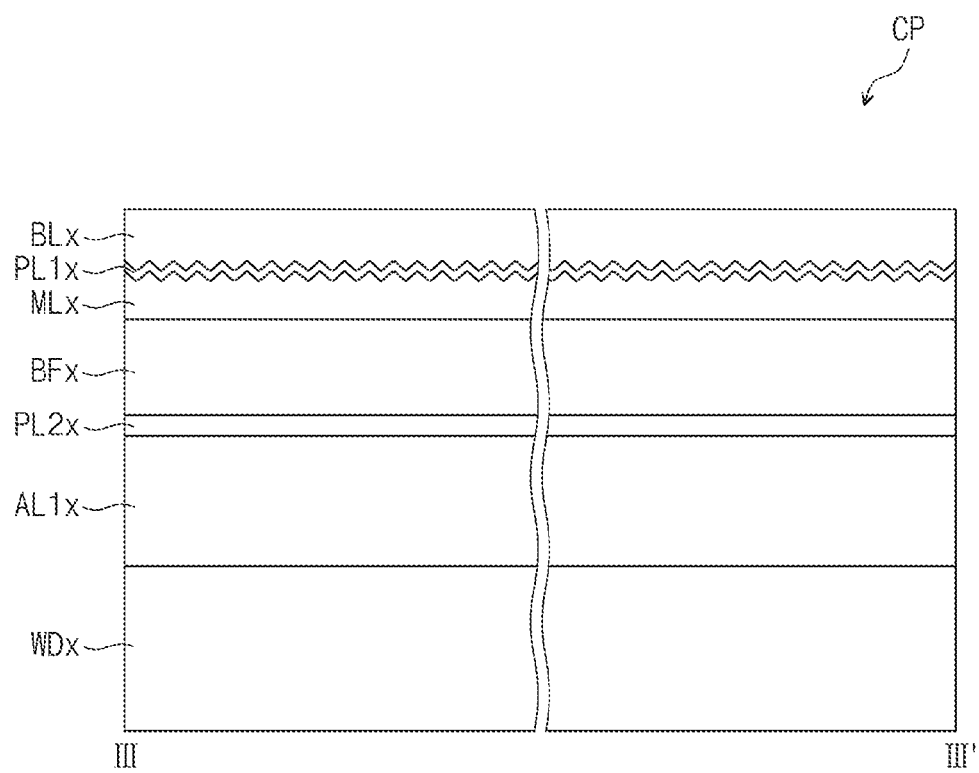
FIG. 13 is a cross-sectional view taken along a line II-II' of FIG. 1, according to one embodiment.

FIG. 13 is a cross-sectional view taken along a line II-II' of FIG. 1, according to one embodiment. FIG. 13 shows only the cover member CP and the display panel DP and the cover unit WU are omitted.

The cover member CP may also be referred to as a cover unit. The cover member CP includes a first base member WDx, an adhesive layer AL1x, a second base member BFx, a reflective layer PL1x, a color layer PL2x, a base layer MLx, and a shielding layer BLx. According to the present exemplary embodiment, the cover member CP may not include an area through which the image transmits. Accordingly, each of the reflective layer PL1x and the color layer PL2x of the cover member CP may be overlapped with an entire surface of the first base member WDx. Similar to the color layer PL2, PL2a, and PL2b of the cover unit WU and WU1 to WUg shown in FIGS. 4 to 12, the color layer PL2x of the cover member CP may be used to implement a color of the cover member CP, and the reflective layer PL1x may be used to impart a visual special effect (e.g., a metallic effect) of the cover member CP.

Figure 14:
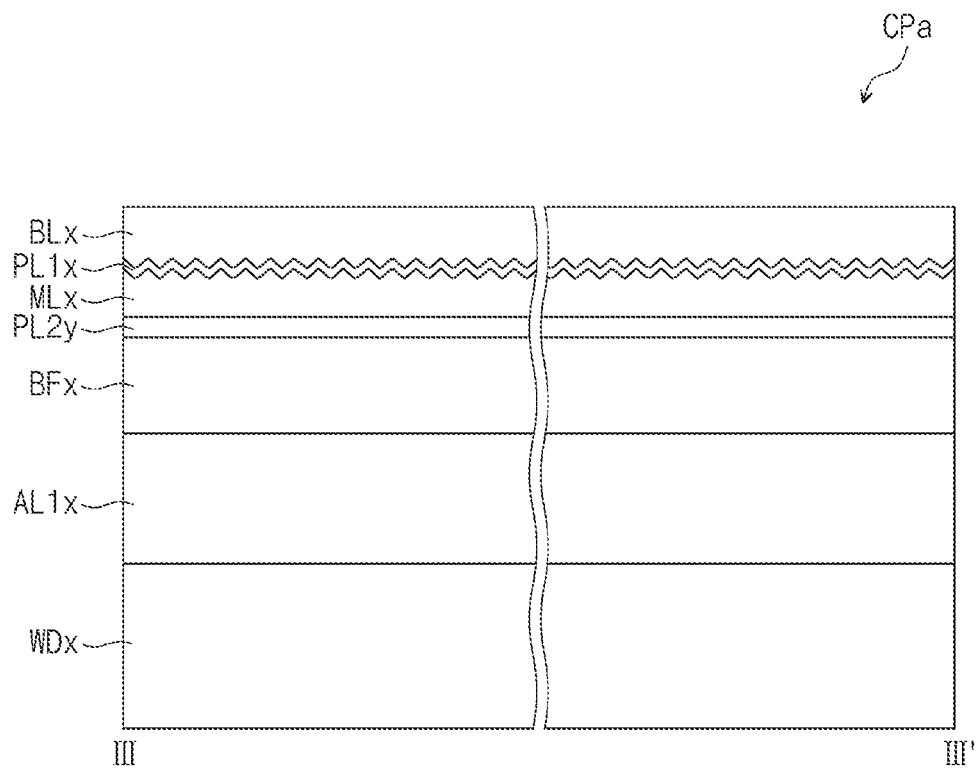
FIG. 14 is a cross-sectional view taken along a line III-III' of FIG. 2, according to another embodiment.
Figure 14:
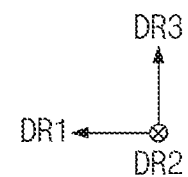

FIG. 14 is a cross-sectional view taken along a line III-III' of FIG. 2, according to another embodiment. A cover member CPa shown in FIG. 14 may have the same structure and function as those of the cover member CP shown in FIG. 13 except for a position of a color layer PL2y. According to the present exemplary embodiment, the color layer PL2y is disposed between the second base member BFx and the base layer MLx. That is, the color layer PL2y and the reflective layer PL1x may be disposed on the same surface of the second base member BFx.

Although not shown in figures, the second base member BFx may be omitted according to another embodiment. The color layer PL2y may be directly disposed on the adhesive layer AL1x. The adhesive layer AL1x may further include a hard coating layer, according to one embodiment.

Figure 15:
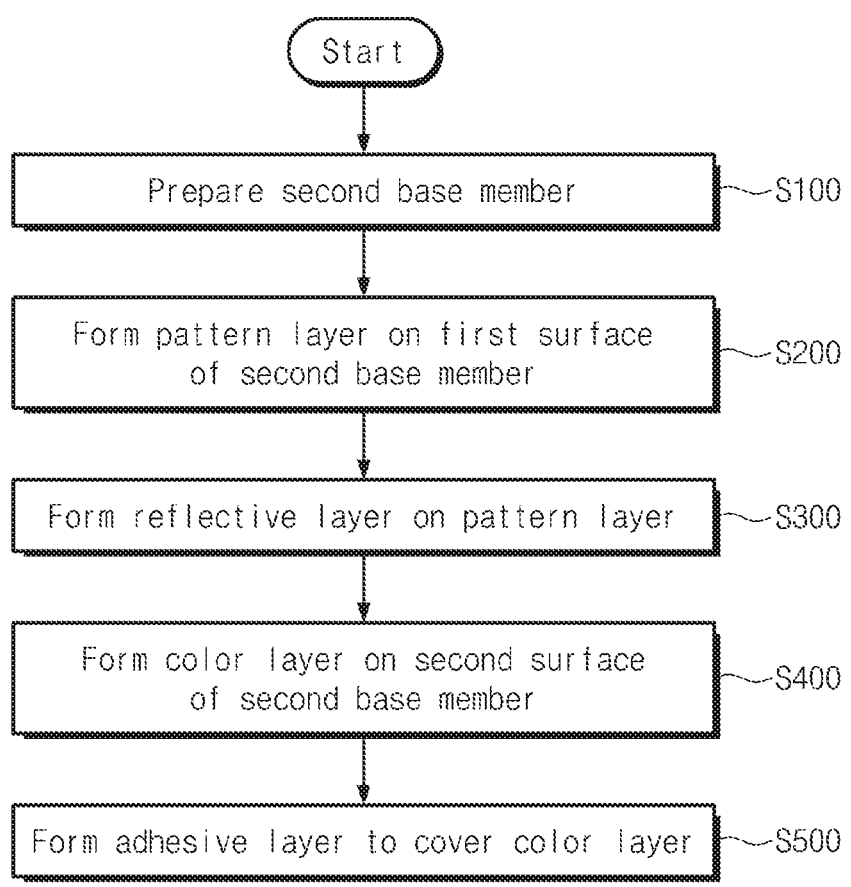
FIG. 15 is a flowchart showing a method of forming a cover unit, according to one exemplary embodiment of the present disclosure.
Figure 16:
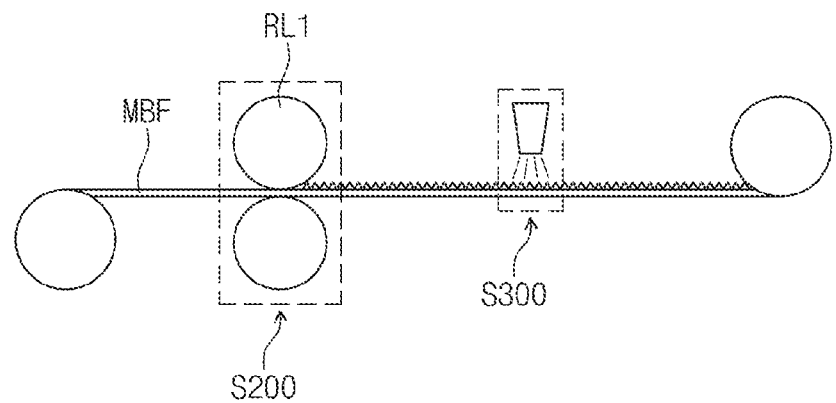
FIG. 16 is a view showing a method of forming a cover unit, according to one exemplary embodiment of the present disclosure.
Figure 17:
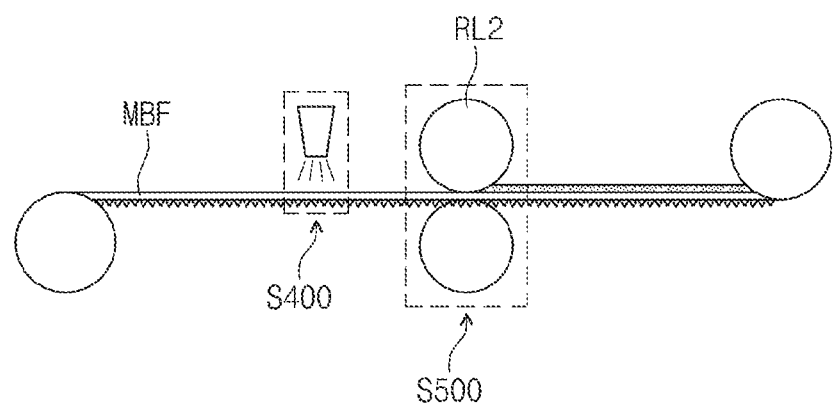
FIG. 17 is a view showing a method of forming a cover unit, according to another exemplary embodiment of the present disclosure.

FIG. 15 is a flowchart showing a method of forming a cover unit, according to one exemplary embodiment of the present disclosure, FIG. 16 is a view showing a method of forming a cover unit, according to one exemplary embodiment of the present disclosure, and FIG. 17 is a view showing a method of forming a cover unit, according to another exemplary embodiment of the present disclosure.

Referring to FIGS. 15, 16, and 17, a second base member MBF is prepared (S100). The second base member MBF may be provided while being rolled on a roller. The second base member MBF may be cut later to have substantially the same shape as that of the second base member BF shown in FIG. 4.

The pattern layer ML1 is formed on the first surface BFs1 of the second base member MBF (S200). The pattern layer ML1 is formed by a roll-to-roll imprint process. For example, a light-curable resin is provided onto the first surface BFs1 of the second base member MBF, and the surface provided with the light-curable resin is pressed by a pattern roll RL1. In this case, the ultraviolet ray is irradiated onto the light-curable resin to cure the light-curable resin, and thus the pattern PT is formed on the pattern layer ML1. In one embodiment, a pattern corresponding to the pattern PT is formed on the pattern roll RL1. In another embodiment, a film provided with a pattern corresponding to the pattern PT is provided on the pattern roll RL1. However, it is understood that various manufacturing processes and methods can be used to form the pattern layer ML1, and the manufacturing process and method of forming the pattern layer ML1 should not be limited to or by these examples.

After the pattern layer ML1 is formed, the reflective layer PL1 is formed on the pattern layer ML1 (S300). In one embodiment, the reflective layer PL1 is formed through a depositing process. FIG. 16 shows only one deposition source, but the number of the depositing sources should not be limited to one. The reflective layer PL1 may include a plurality of layers, and thus the number of the depositing sources may increase.

In the present exemplary embodiment, the reflective layer PL1 may serve as a common layer, and the color and/or composition of the reflective layer PL1 may not be changed to implement a different color of the cover unit WU and/or the cover member CP. In one embodiment, the pattern layer ML1 and the reflective layer PL1 may be formed through a common process regardless of a color implemented by the cover unit WU and/or the cover member CP. As a result, processes shown in FIG. 16 may be common regardless of the color of the cover unit WU.

The color layer PL2 is formed on the second surface BFs2 of the second base member MBF, on which the pattern layer ML1 and the reflective layer PL1 are formed (S400). The color layer PL2 is used to implement the color of the cover unit WU. In one embodiment, the color layer PL2 is formed by a transfer method. However, it is understood that the color layer PL2 may be formed by various methods including, but not limited to, a silk screen printing method, and a digital printing method.

The formation of the color layer PL2 by the transfer method may reduce process and/or color variations to implement the color of the cover unit WU. Different from the present exemplary embodiment, in a case that the color implementation layer is formed after the second base member is loaded in a deposition chamber, process variations may occur depending on the position of the second base member in the deposition chamber because a physical condition may vary within a single deposition chamber and/or in different deposition chambers. According to the exemplary embodiment of the present disclosure, the color layer PL2 is formed by a roll-to-roll process, and thus the process variations that may be caused by the varying conditions of the deposition chamber and the position of the second base member in the deposition chamber may be reduced. Accordingly, the color difference of the cover unit WU is reduced, and the product manufacturing yield may be improved.

After the color layer PL2 is formed, the adhesive layer AL1 is formed to cover the color layer PL2 (S500). In the present exemplary embodiment, the adhesive layer AL1 may be an optically clear adhesive film. In this case, the optically clear adhesive film may be provided while the second base member MBF is rolled on a roller RL2. When the second base member MBF moves, the optically clear adhesive film rolled on the roller RL2 is attached to the second base member MBF.

FIGS. 16 and 17 show the cover unit continuously formed through a roll-to-roll process as a representative example. However, it is understood that various other processes may be applied to manufacture a cover unit, and the method of forming the cover unit should not be limited to or by the exemplary embodiments described herein. For example, the cover unit may be formed by a batch process in a predetermined unit of sheets.

Although the exemplary embodiments of the present disclosure have been described, it is understood that the present disclosure should not be limited to these exemplary embodiments, and various changes and modifications can be made by one ordinary skilled in the art within the spirit and scope of the present disclosure.

What is claimed is:

1. A display device comprising:
   a cover unit; and
   a display panel disposed under the cover unit, the cover unit comprising:
   a first base member disposed on the display panel and comprising a first area and a second area when viewed in a plan view;
   a pattern layer disposed between the first base member and the display panel;
   a color layer disposed between the first base member and the pattern layer; and
   a reflective layer disposed between the display panel and the pattern layer.

2. The display device of claim 1, wherein the reflective layer is overlapped with the color layer when viewed in a plan view.

3. The display device of claim 1, wherein the cover unit further comprises a second base member disposed between the color layer and the pattern layer.

4. The display device of claim 3, wherein the second base member is not overlapped with the second area when viewed in a plan view.

5. The display device of claim 3, wherein the color layer comprises:
   a primer layer disposed on the second base member; and
   a color implementing layer disposed on the primer layer.

6. The display device of claim 1, wherein the cover unit further comprises a second base member disposed between the color layer and the first base member.

7. The display device of claim 1, wherein the display panel comprises a display area overlapped with the second area and displaying an image and a non-display area overlapped with the first area and not displaying the image, and the reflective layer and the color layer are overlapped with the first area when viewed in a plan view and not overlapped with the second area.

8. The display device of claim 1, wherein the pattern layer further comprises a pattern disposed on one surface of the pattern layer that makes contact with the reflective layer.

9. The display device of claim 8, wherein the cover unit further comprises a cover layer covering the pattern layer, and the pattern is overlapped with the first area and the second area when viewed in a plan view.

10. The display device of claim 8, wherein a portion of the pattern overlapped with the second area is flat.

11. The display device of claim 8, wherein the pattern is disposed only on a portion of the pattern layer that is overlapped with the first area when viewed in a plan view.

12. The display device of claim 1, wherein the pattern layer is not overlapped with the second area when viewed in a plan view.

13. The display device of claim 1, wherein, when the first area has a first color when viewed in a plan view, the reflective layer has a second color, and the color layer has a third color, and when the first area has a fourth color that is different from the first color when viewed in a plan view, the reflective layer has the second color, and the color layer has a fifth color that is different from the third color.

14. The display device of claim 1, wherein the cover unit further comprises a shielding layer disposed between the reflective layer and the display panel, and the shielding layer covers the reflective layer.

15. The display device of claim 1, wherein the cover unit further comprises an adhesive layer disposed between the color layer and the first base member.

16. The display device of claim 15, wherein the adhesive layer is overlapped with the first area and not overlapped with the second area when viewed in a plan view.

17. The display device of claim 1, wherein the reflective layer imparts a metallic effect.

18. The display device of claim 1, further comprises a cover member disposed on a rear side of the display panel, wherein the cover member comprises a third base member, a second reflective layer, and a second color layer.

19. A cover unit comprising:
   a first base member;
   a pattern layer disposed on the first base member;
   a reflective layer disposed on the pattern layer; and
   a color layer disposed between the first base member and the pattern layer,
   wherein the reflective layer, the color layer, and the first base member are overlapped with each other when viewed in a plan view.

20. The cover unit of claim 19, further comprising:
   an adhesive layer disposed between the color layer and the first base member;
   a second base member disposed between the color layer and the pattern layer or disposed between the color layer and the first base member; and
   a shielding layer covering the reflective layer.

21. The cover unit of claim 19, further comprising a cover layer covering the pattern layer.

22. The cover unit of claim 19, wherein the first base member comprises a first area and a second area defined therein when viewed in a plan view, and each of the reflective layer and the color layer is overlapped with the first area and not overlapped with the second area when viewed in a plan view.

23. The cover unit of claim 19, wherein the reflective layer imparts a metallic effect.

24. The cover unit of claim 23, wherein the reflective layer has a second color, and the color layer has a third color, and wherein the first area implements a first color when viewed in a plan view by optically combining the second color of the reflective layer and the third color of the color layer.

25. The cover unit of claim 19, further comprising a second base member disposed between the color layer and the reflective layer, wherein the color layer directly makes contact with one surface of the second base member.

26. A method for forming a cover unit, the method comprising:
   forming a pattern layer including a pattern on a first surface of a base member by a roll-to-roll imprint process;
   forming a reflective layer on the pattern layer by a depositing process;
   forming a color layer on a second surface of the base member by a roll-to-roll process; and
   forming an adhesive layer to cover the color layer,
   wherein the reflective layer, the color layer, and the base member are overlapped with each other when viewed in a plan view.

* * * * *